(12) United States Patent
Yan

(10) Patent No.: US 8,759,208 B2
(45) Date of Patent: Jun. 24, 2014

(54) METHOD FOR MANUFACTURING CONTACT HOLES IN CMOS DEVICE USING GATE-LAST PROCESS

(75) Inventor: Jiang Yan, Newburgh, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 523 days.

(21) Appl. No.: 13/141,982

(22) PCT Filed: Feb. 21, 2011

(86) PCT No.: PCT/CN2011/000261
§ 371 (c)(1),
(2), (4) Date: Jun. 23, 2011

(87) PCT Pub. No.: WO2012/062021
PCT Pub. Date: May 18, 2012

(65) Prior Publication Data
US 2012/0196432 A1  Aug. 2, 2012

(30) Foreign Application Priority Data

Nov. 11, 2010 (CN) .......................... 2010 1 0542475

(51) Int. Cl.
*H01L 21/3205* (2006.01)
(52) U.S. Cl.
USPC ...................................... 438/586; 257/E21.19

(58) Field of Classification Search
USPC ...................................... 257/E21.19; 438/586
See application file for complete search history.

(56) References Cited

U.S. PATENT DOCUMENTS

2006/0071285 A1   4/2006   Datta et al. ................... 257/407

FOREIGN PATENT DOCUMENTS

CN              1832113 A       9/2006
JP          2005-79206 A        3/2005

*Primary Examiner* — Marvin Payen
(74) *Attorney, Agent, or Firm* — Martine Penilla Group, LLP

(57) ABSTRACT

The present invention provides a method for manufacturing contact holes in a CMOS device by using a gate-last process, comprising: forming high-K dielectrics/metal gates (HKMG) of a first type MOS; forming and metalizing lower contact holes of the source/drain of a first type MOS and a second type MOS as well as forming HKMG of a second type MOS simultaneously, wherein the lower contact holes of the source/drain are filled with the same material as that used by the metal gate of the second type MOS; forming and metalizing contact holes of metal gates of a first type MOS and a second type MOS as well as upper contact holes of the source/drain, wherein the upper contact holes of the source/drain are aligned with the lower contact holes of the source/drain. The method reduces the difficulty of contact hole etching and metal deposition, simplifies the process steps, and increases the reliability of the device.

25 Claims, 5 Drawing Sheets

US 8,759,208 B2

METHOD FOR MANUFACTURING CONTACT HOLES IN CMOS DEVICE USING GATE-LAST PROCESS

CROSS REFERENCE

This application is a Section 371 National Stage Application of International Application No. PCT/CN2011/000261, filed Feb. 21, 2011, which claims priority to CN 201010542475.5, filed Nov. 11, 2010, the entire contents of which are incorporated herein by reference in their entirety.

FIELD OF THE INVENTION

The present invention relates to a method for manufacturing a semiconductor device, particularly to a method for manufacturing contact holes in a CMOS device.

BACKGROUND OF THE INVENTION

In the traditional MOS transistor process, polysilicon is commonly used as the gate material, but with continuous reduction in the device geometry, a higher gate leakage current is caused due to reduction in the thickness of the polysilicon gate/gate oxidation layer. The feature size of the existing device enters 32 nm node, at this scale, a solution of substituting the high-K dielectrics/metal gate (HKMG) structure for the gate oxidation layer/polysilicon gate structure has been put forward. It is reported by Intel that the gate leakage current may be reduced to one tenth of what it has been when high-K dielectric materials are used. So far, application of high-K dielectrics/metal gate structure becomes an inexorable trend for the development of the integrated circuit of generation of techniques of 32 nm and below.

However, in terms of the process of manufacturing a transistor of HKMG structure, two camps, which are the school of gate-first process represented by IBM and the school of gate-last process represented by Intel, respectively, exist within the industry. The gate-first integration scheme is similar to the existing polysilicon gate/gate oxidation layer process, but the metal gate is vulnerable to multiple thermal processing including high temperature junction annealing, thereby causing drift of electrical properties. In the gate-last integration, the polysilicon gate will be substituted by the metal gate subsequently through the following thermal processing and relevant processes. The gate-last process has an advantage that all processes within the metal silicide working procedure will not have an effect on the high-K insulating material or metal gate. For now, the gate-last integration scheme is a unique HKMG technology that is applied to product.

The existing method for manufacturing a CMOS device of HKMG structure by using a gate-last process is that, when the HKMG structures of an NMOS and a PMOS are manufactured and the contact holes are etched as shown in FIG. 1, since the depth to width ratio d/w of the contact hole of source/drain S/D is gradually increased with continuous reduction in the width w of the contact hole, from 32 nm node, the complicated process including two photolithographes and two etchings is forced to be used. Meanwhile, deposition of interconnection metal in such contact holes also becomes difficult. This will inevitably lead to a great increase in the manufacturing cost. Furthermore, as shown in the FIGURE, another disadvantage is that, while performing metal deposition to the source/drain contact hole, the deposited metal (typically W or Cu) may easily enter into the device per se to destroy the performance of the device since the contact hole is straightly down to the thinner metal silicide layer on the source/drain.

SUMMARY OF THE INVENTION

The technical problem to be solved by present invention is to provide a new method for manufacturing contact holes by using a gate-last process, which reduces the difficulty of contact hole etching and metal deposition, simplifies the process steps, and increases the reliability of the device.

To solve the above technical problem, in accordance with the embodiment of the present invention, there is provided a method for manufacturing contact holes in a CMOS device by using a gate-last process, comprising:
forming high-K dielectrics/metal gates (HKMG) of a first type MOS;
forming and metalizing lower contact holes of the source/drain of a first type MOS and a second type MOS, and forming HKMG of a second type MOS simultaneously, wherein the lower contact holes of the source/drain are filled with the same material as that used by the metal gate of the second type MOS;
forming and metalizing contact holes of metal gates of a first type MOS and a second type MOS as well as the upper contact holes of the source/drain, wherein the upper contact holes of the source/drain are aligned with the lower contact holes of the source/drain; and
wherein the type of the first type MOS is opposite to that of the second type MOS.

BRIEF DESCRIPTION OF THE DRAWINGS

To understand the present invention well and to show how it is effected, the accompanying drawings will now be referenced through the embodiments, wherein.

DETAILED DESCRIPTION OF THE INVENTION

Figure 1:
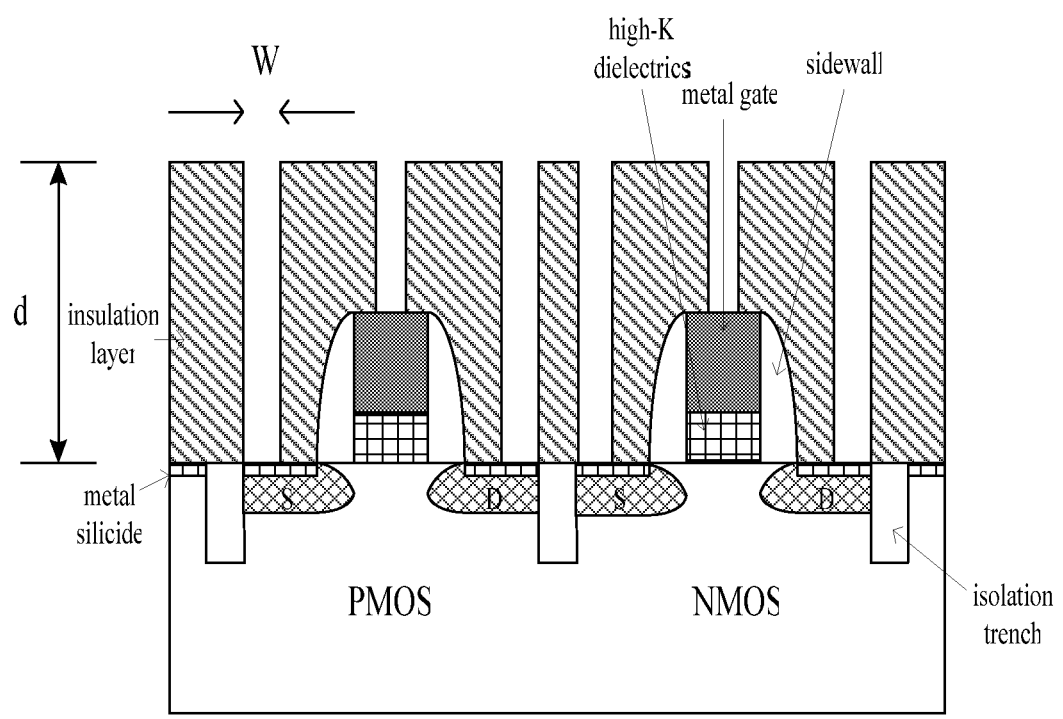
FIG. 1 is a schematic diagram illustrating the structure of the contact hole of a CMOS device manufactured by a gate-last process at present.

One or more aspects of the embodiments of the present invention will be described with reference to the accompanying drawings, where identical elements will be generally indicated by identical reference numerals throughout the drawings. In the following descriptions, many specific details are elaborated for the purpose of explanation so as to facilitate thorough understanding of one or more aspects of the embodiments of the present invention. However, it may be apparent to those skilled in the art that they may use few of these specific details to implement one or more aspects of the embodiments of the present invention.

In addition, although the specific features or aspects of an embodiment are merely disclosed by one of the implementing modes, such specific features or aspects may be incorporated with one or more other features or aspects of other implementing modes that may be advantageous to and desired by any given or specific application.

There is provided a substrate, which may be of any type known in the field of electronics, such as bulk silicon, Semiconductor-On-Insulator (SOI), full depletion, partial depletion, FIN type or any other type.

Figure 2:
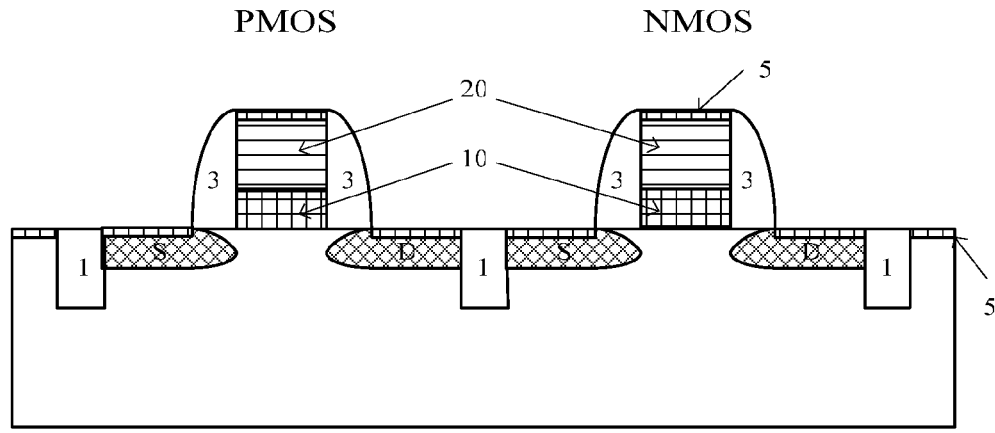
FIG. 2 is a schematic diagram illustrating formation of a source/drain and a CMOS device including the high-K dielectric layer and polysilicon gate.

As shown in FIG. 2, isolation trench 1 and the active region of the device are located by using a CMOS process (photolithography, etching), and high-K dielectric layer 10 and sacrificial polysilicon gate electrode layer 20 are sequentially deposited. Wherein the material of high-K dielectric layer 10 may be $ZrO_2$, $HfO_2$, $Al_2O_3$, HfSiO, HfSiON and/or combination thereof. In another embodiment, after the isolation trench and active region of the device are located, the sacrificial gate oxidation layer (not shown in the FIGURE) instead of the high-K dielectric layer 10 as shown in FIG. 2 is deposited, then the sacrificial polysilicon gate electrode layer 20 is deposited, wherein the sacrificial gate oxidation layer is $SiO_2$ or SiON.

After manufacturing sidewall 3, source/drain ion implantation and annealing are performed to form a source/drain region (S/D), then metal silicide 5 is formed on the silicon surface of the source/drain region and the polysilicon gate electrode, wherein the metal silicide is NiPt metal silicide, preferably the metal silicide has a thickness of 20 nm.

Lower insulation layer 30 is deposited, the deposited lower insulation layer, the thickness of which is greater than that of the gate step, completely covers the gate step. Generally, the lower insulation layer comprises two layers, that is, a lower SIN and an upper $SiO_2$, preferably the SIN has a thickness of 50 nm and the SiO, has a thickness of 300 nm.

Lower insulation layer 30 is planarized by Chemical Mechanical Planarization (CMP) with the portion higher than the polysilicon gate removed.

The sacrificial polysilicon gate electrode layer region of a PMOS is exposed by photolithography.

Sacrificial polysilicon gate electrode layer 20 of a PMOS is removed by using a wet or dry etching. In another embodiment, in a case where the sacrificial gate oxidation layer instead of the high-K dielectric layer 10 is deposited before forming the source/drain region, the sacrificial polysilicon gate electrode layer and the sacrificial gate oxidation layer below (not shown) are needed to be removed together, wherein the sacrificial gate oxidation layer is $SiO_2$ or SiON.

Figure 3:
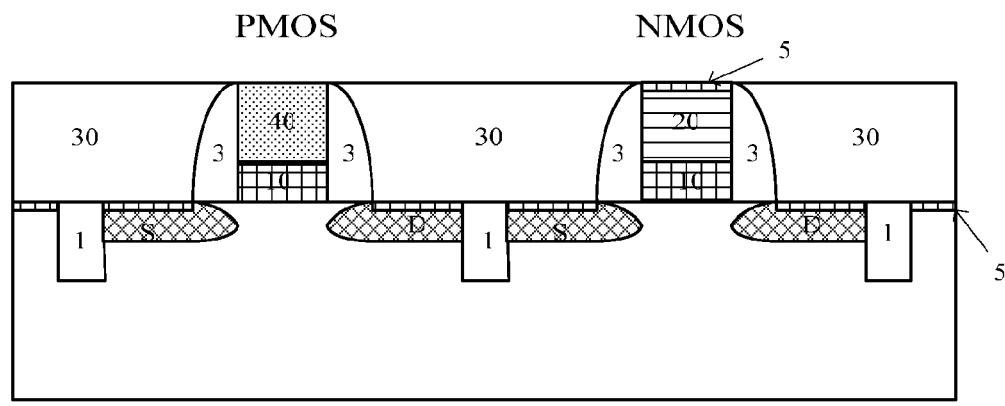
FIG. 3 is a schematic diagram of a CMOS device having the PMOS HKMG structure formed.

The PMOS gate is filled with PMOS metal gate material 40 by deposition and planarized by Chemical Mechanical Planarization (CMP), to thereby obtain the HKMG structure of the PMOS, as shown in FIG. 3. Wherein deposition of the PMOS metal gate material 40 is performed by sequentially depositing material with the appropriate work function and metal filling material (not shown in lamination in the FIGURE) by using Atomic Layer Deposition (ALD) or sputtering process, more preferably, the material with appropriate work function is TiN, and the metal filling material is TiAl, Al or W.

In another embodiment, in a case where the sacrificial polysilicon gate oxidation layer and the sacrificial gate oxidation layer below (not shown) are removed, the PMOS high-K dielectric layer material and PMOS metal gate material 40 are sequentially deposited, wherein the material of high-K dielectric layer includes $ZrO_2$, $HfO_2$, $Al_2O_3$, HfSiO, HfSiON and/or combination thereof.

The sacrificial polysilicon gate electrode layer region of an NMOS is exposed by photolithography.

Figure 4:
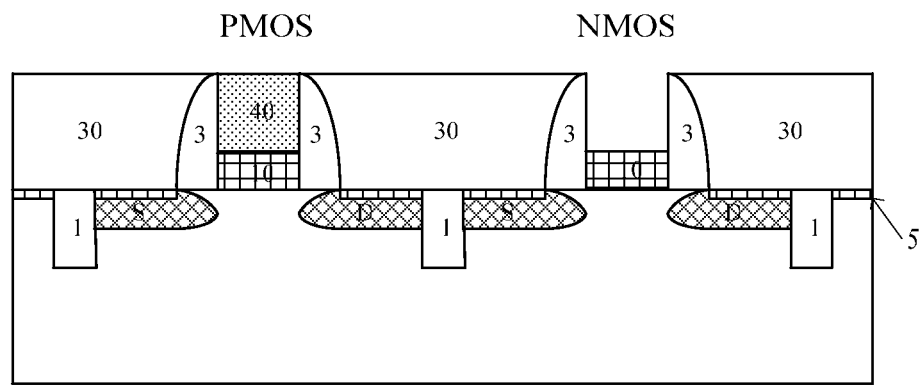
FIG. 4 is a schematic diagram of a CMOS device having the NMOS polysilicon gate removed.

Sacrificial polysilicon gate electrode layer 20 of an NMOS is removed by using a wet or dry etching, as shown in FIG. 4. In another embodiment, in a case where the sacrificial gate oxidation layer instead of the high-K dielectric gate is deposited before forming the source/drain region, the sacrificial polysilicon gate electrode layer and the sacrificial gate oxidation layer below (not shown) are needed to be removed together, wherein the sacrificial gate oxidation layer is $SiO_2$ or SiON.

Figure 5:
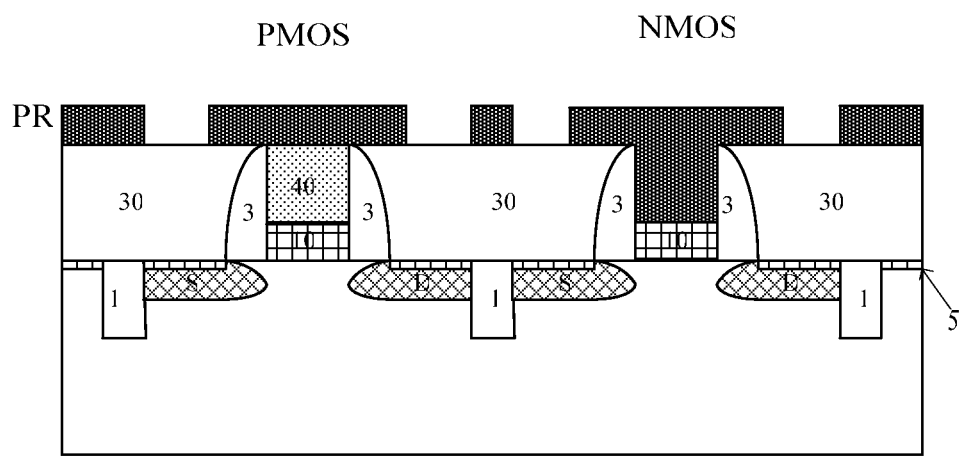
FIG. 5 is a schematic diagram of a CMOS device having the positions of contact holes of the source/drain exposed by photolithography.

The position of the source/drain is exposed by photolithography to form a Photoresist (PR) pattern, then the gate structure having the sacrificial polysilicon gate electrode layer of an NMOS removed is also filled with photoresist, as shown in FIG. 5.

Figure 6:
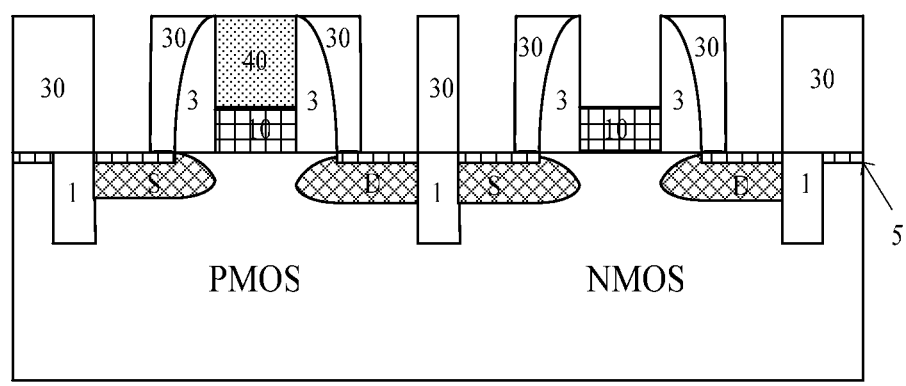
FIG. 6 is a schematic diagram of a CMOS device having the surface insulation layer etched and the lower contact holes of the source/drain exposed.

The exposed lower insulation layer 30 is etched down to the metal silicide on the surface of the source/drain, so as to form lower contact holes of the source/drain, the structure obtained is as shown in FIG. 6.

Figure 7:
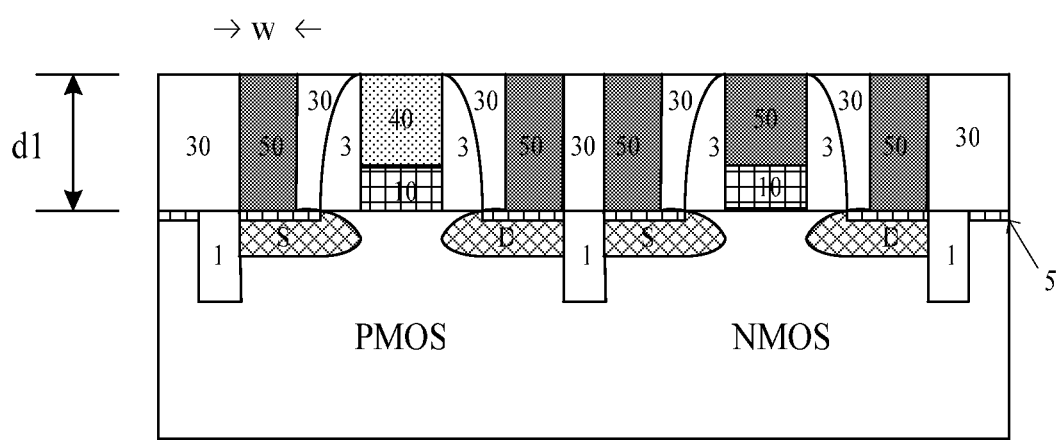
FIG. 7 is a schematic diagram of a CMOS device having performed metal filling to the lower contact holes of the source/drain as well as the NMOS gate structure having the polysilicon removed.

The lower contact holes of the source/drain and the NMOS gate obtained by removing the NMOS sacrificial polysilicon gate electrode layer 20 are simultaneously deposited and filled with the NMOS metal gate material 50, then they are planarized by CMP, thus the etching and metalizing of the NMOS HKMG structure and the lower contact holes of the source/drain can be simultaneously performed, as shown in FIG. 7. The advantageous effect by doing so is that the depth to width ratio (d1/w) of the lower contact hole of source/drain is decreased with respect to the depth to width ratio (d/w) of the contact hole of source/drain as shown in FIG. 1, thus the difficulty of etching and depositing metal is decreased. On the other hand, the lower contact holes of the source/drain are deposited with the same metal material as that of the NMOS gate structure, the process is simplified. In a preferred embodiment, the step of depositing NMOS metal gates comprises two substeps, that is, sequentially depositing the material with appropriate work function and metal filling material (not shown in lamination in the FIGURE), more preferably, the material with appropriate work function is TiN, and the metal filling material is TiAl, Al or W. Furthermore, the metal gate deposition may select the techniques such as sputtering, ALD. In an another embodiment, in a case where the sacrificial gate oxidation layer instead of the high-K dielectric gate 10 is deposited before forming the source/drain region, and the gate polysilicon and the silicon oxidation layer below are removed together, it is also needed to use photolithography, etching and deposition process to form an NMOS high-K gate dielectric layer before depositing NMOS metal gate material to lower contact holes of the source/drain and the NMOS gate obtained by removing the NMOS sacrificial polysilicon gate electrode layer 20, wherein the material of the NMOS high-K gate dielectrics may be $ZrO_2$, $HfO_2$, $Al_2O_3$, HfSiO, HfSiON and/or combination thereof.

Upper insulation layer 60 is deposited on the surface of the device.

Figure 8:
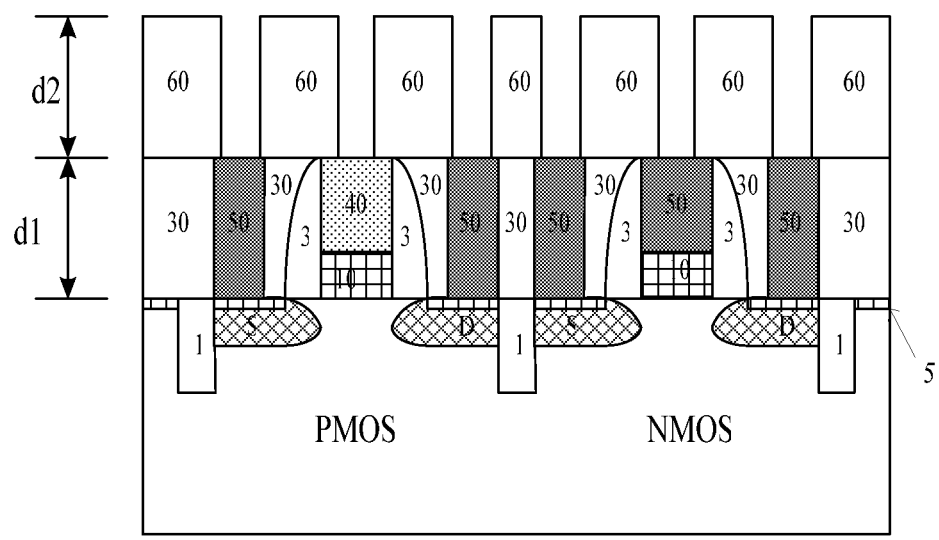
FIG. 8 is a schematic diagram of a CMOS device having the upper contact holes of the source/drain and the gate contact holes formed.

Upper insulation layer 60 is photolithographed and etched to obtain the upper contact holes of the source/drain as well as PMOS and NMOS metal gate contact holes, the structure obtained is as shown in FIG. 8.

Isolation layer materials Ti and TiN are sequentially deposited (not shown).

Figure 9:
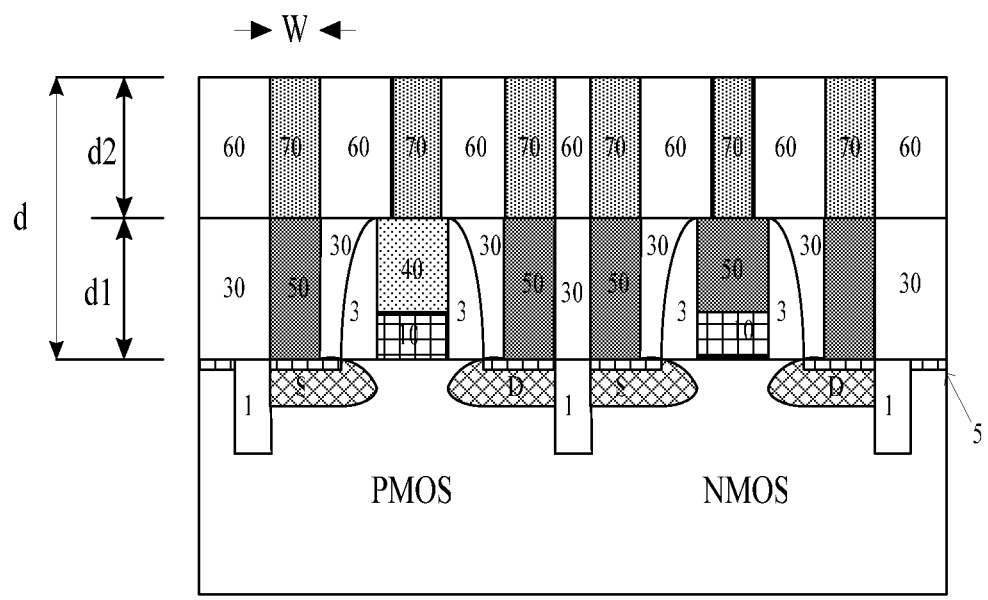
FIG. 9 is a schematic diagram of a CMOS device having the upper contact holes of source/drain as well as the gate contact holes metalized.

Interconnection metal 70 is deposited to fill the etched metal gate contact holes and the upper contact holes of the source/drain and planarize the portions higher than the upper insulation layer by Chemical Mechanical Planarization (CMP), as shown in FIG. 9. The advantageous effect by doing so is that the depth to width ratio (d2/w) of the upper contact hole of source/drain is decreased with respect to the depth to width ratio (d/w) of the contact hole of source/drain as shown in FIG. 1, thus the difficulty of etching and depositing metal is decreased. Meanwhile, the contact holes of the source/drain are divided into two parts to be manufactured, so that the interface of the upper contact hole and the lower contact hole is lifted to the surface of the gate structure, which is advantageous to lower the chance of short circuit between the source/drain contact holes and the gate, so as to better protect the gate structure. In another preferred embodiment, the interconnection metal of the upper contact hole of the source/drain is preferably TiAl, W or Cu. In a further preferred embodiment, the interconnection metal of the upper contact hole of the source/drain and the interconnection metal of the lower contact hole of the source/drain select the same material, which is advantageous to reduce the contact resistance of the interface of the upper contact hole and the lower contact hole of the source/drain and whereby enhance the performance of the device.

It should be understood that the above embodiment and the involved figures are merely schematically illustrated. As known to those skilled in the art, more or less elements as shown in the figures may be comprised in the structure, but they would not influence the scope of the embodiment of the present invention. In addition, although in the above embodiment the PMOS metal gate structure is first manufactured, whereas the lower contact hole of the source/drain and the NMOS metal gate structure are manufactured simultaneously, it will be apparent to those skilled in the art they may be manufactured in an reversed order, that is, the NMOS metal gate structure is first manufactured, whereas the lower contact hole of the source/drain and the PMOS metal gate structure are manufactured simultaneously. The scope of the present invention includes any other embodiments and applications that may use the above structures and methods. Therefore, the scope of the present invention shall be determined by referring to the scope of the attached claims as well as the scope of the equivalents that are assigned with such claims.

What is claimed is:

1. A method for manufacturing contact holes in a CMOS device by using a gate-last process, comprising:
    forming high-K dielectrics/metal gates (HKMG) of a first type MOS;
    forming and metalizing lower contact holes of the source/drain of a first type MOS and a second type MOS as well as forming HKMG of a second type MOS simultaneously, wherein the lower contact holes of the source/drain are deposited with the same material as that used by the metal gate of the second type MOS;
    forming and metalizing contact holes of metal gates of a first type MOS and a second type MOS as well as upper contact holes of the source/drain, wherein the upper contact holes of the source/drain are aligned with the lower contact holes of the source/drain; and
    wherein the type of the first type MOS is opposite to that of the second type MOS.

2. The method for manufacturing contact holes in a CMOS device by using a gate-last process of claim 1, wherein forming HKMG of a first type MOS comprises:
    forming a gate structure including high-K dielectric layer (10) and sacrificial polysilicon gate electrode layer (20);
    forming a source/drain;
    forming metal silicide on the surface of the source/drain and the sacrificial polysilicon gate electrode layer (20);
    depositing and planarizing lower insulation layer (30) to the height of the gate structure;
    removing the sacrificial polysilicon gate electrode layer (20) of a first type MOS; and
    depositing metal gate material (40) of a first type MOS.

3. The method for manufacturing contact holes in a CMOS device by using a gate-last process of claim 1, wherein forming HKMG of a first type MOS comprises:
    forming a gate structure including the sacrificial gate oxidation layer and sacrificial polysilicon gate electrode layer (20);
    forming a source/drain;
    forming metal silicide on the surface of the source/drain and the sacrificial polysilicon gate electrode layer (20);
    depositing and planarizing lower insulation layer (30) to the height of the gate structure;
    removing the sacrificial gate oxidation layer and sacrificial polysilicon gate electrode layer (20) of a first type MOS; and
    sequentially depositing high-K dielectric layer (10) and metal gate material (40) of a first type MOS.

4. The method for manufacturing contact holes in a CMOS device by using a gate-last process of claim 3, wherein the sacrificial gate oxidation layer is $SiO_2$ or SiON.

5. The method for manufacturing contact holes in a CMOS device by using a gate-last process of claim 2, wherein the material of the high-K gate dielectric layer includes $ZrO_2$, $HfO_2$, $Al_2O_3$, HfSiO, HfSiON and/or combination thereof.

6. The method for manufacturing contact holes in a CMOS device by using a gate-last process of claim 2, wherein the deposition of the metal gate material 40 of a first type MOS includes sequentially depositing the material with appropriate work function and metal filling material.

7. The method for manufacturing contact holes in a CMOS device by using a gate-last process of claim 6, wherein the material with appropriate work function is TiN, and the metal filling material is TiAl, Al or W.

8. The method for manufacturing contact holes in a CMOS device by using a gate-last process of claim 2, wherein the metal gate material is deposited by using sputtering or Atomic Layer Deposition (ALD) method.

9. The method for manufacturing contact holes in a CMOS device by using a gate-last process of claim 1, wherein
    forming and metalizing lower contact holes of the source/drain of a first type MOS and a second type MOS as well as forming HKMG of a second type MOS simultaneously comprises:
removing the sacrificial polysilicon gate electrode layer (20) of a second type MOS;
    exposing the positions of the contact holes of the source/drain by photolithography;
    etching the lower insulation layer (30) down to the metal silicide on the surface of the source/drain, so as to form lower contact holes of the source/drain; and
    depositing metal gate material (50) of a second type MOS to the lower contact holes of the source/drain and the gate structure of a second type MOS obtained by removing the sacrificial polysilicon gate electrode layer (20) of a second type MOS.

10. The method for manufacturing contact holes in a CMOS device by using a gate-last process of claim 9, wherein depositing the metal gate material (50) of a second type MOS comprises: sequentially depositing the material with appropriate work function and metal filling material.

11. The method for manufacturing contact holes in a CMOS device by using a gate-last process of claim 9, wherein the material with appropriate work function is TiN, and the metal filling material is TiAl, Al or W.

12. The method for manufacturing contact holes in a CMOS device by using a gate-last process of claim 9, wherein the metal gate material is deposited by using sputtering or ALD method.

13. The method for manufacturing contact holes in a CMOS device by using a gate-last process of claim 1, wherein
forming and metalizing lower contact holes of the source/drain of a first type MOS and a second type MOS as well as forming HKMG of a second type MOS simultaneously comprises:
removing the sacrificial polysilicon gate electrode layer (20) of a second type MOS and the sacrificial gate oxidation layer below;
exposing the positions of the contact holes of the source/drain by photolithography;
etching the lower insulation layer (30) down to the metal silicide on the surface of the source/drain, so as to form lower contact holes of the source/drain;
forming a high-K dielectric layer of a second type MOS; and
depositing metal gate material (50) of a second type MOS to the lower contact holes of the source/drain and the high-K dielectric layer of a second type MOS.

14. The method for manufacturing contact holes in a CMOS device by using a gate-last process of claim 13, wherein the sacrificial gate oxidation layer is $SiO_2$ or SiON.

15. The method for manufacturing contact holes in a CMOS device by using a gate-last process of claim 13, wherein depositing the metal gate material (50) of a second type MOS comprises: sequentially depositing the material with appropriate work function and metal filling material.

16. The method for manufacturing contact holes in a CMOS device by using a gate-last process of claim 13, wherein the material with appropriate work function is TiN, and the metal filling material is TiAl, Al or W.

17. The method for manufacturing contact holes in a CMOS device by using a gate-last process of claim 13, wherein the metal gate material is deposited by using sputtering or ALD method.

18. The method for manufacturing contact holes in a CMOS device by using a gate-last process of claim 13, wherein the material of the high-K gate dielectric layer includes $ZrO_2$, $HfO_2$, $Al_2O_3$, HfSiO, HfSiON and/or combination thereof.

19. The method for manufacturing contact holes in a CMOS device by using a gate-last process of claim 1, wherein forming and metalizing contact holes of metal gates of a first type MOS and a second type MOS as well as the upper contact holes of the source/drain comprises:
depositing upper insulation layer (60) on the surface of the device;
forming contact holes of metal gates of a first type MOS and a second type MOS and upper contact holes of the source/drain, wherein the upper contact holes of the source/drain are aligned with the lower contact holes of the source/drain;
sequentially depositing isolation layer materials Ti and TiN; and
depositing and planarizing interconnection metal (70).

20. The method for manufacturing contact holes in a CMOS device by using a gate-last process of claim 19, wherein the interconnection metal (70) is TiAl, W or Cu.

21. The method for manufacturing contact holes in a CMOS device by using a gate-last process of claim 3, wherein the material of the high-K gate dielectric layer includes $ZrO_2$, $HfO_2$, $Al_2O_3$, HfSiO, HfSiON and/or combination thereof.

22. The method for manufacturing contact holes in a CMOS device by using a gate-last process of claim 3, wherein the deposition of the metal gate material 40 of a first type MOS includes sequentially depositing the material with appropriate work function and metal filling material.

23. The method for manufacturing contact holes in a CMOS device by using a gate-last process of claim 3, wherein the metal gate material is deposited by using sputtering or Atomic Layer Deposition (ALD) method.

24. The method for manufacturing contact holes in a CMOS device by using a gate-last process of claim 2, wherein forming and metalizing lower contact holes of the source/drain of a first type MOS and a second type MOS as well as forming HKMG of a second type MOS simultaneously comprises:
removing the sacrificial polysilicon gate electrode layer (20) of a second type MOS;
exposing the positions of the contact holes of the source/drain by photolithography;
etching the lower insulation layer (30) down to the metal silicide on the surface of the source/drain, so as to form lower contact holes of the source/drain; and
depositing metal gate material (50) of a second type MOS to the lower contact holes of the source/drain and the gate structure of a second type MOS obtained by removing the sacrificial polysilicon gate electrode layer (20) of a second type MOS.

25. The method for manufacturing contact holes in a CMOS device by using a gate-last process of claim 3, wherein forming and metalizing lower contact holes of the source/drain of a first type MOS and a second type MOS as well as forming HKMG of a second type MOS simultaneously comprises:
removing the sacrificial polysilicon gate electrode layer (20) of a second type MOS and the sacrificial gate oxidation layer below;
exposing the positions of the contact holes of the source/drain by photolithography;
etching the lower insulation layer (30) down to the metal silicide on the surface of the source/drain, so as to form lower contact holes of the source/drain;
forming a high-K dielectric layer of a second type MOS; and
depositing metal gate material (50) of a second type MOS to the lower contact holes of the source/drain and the high-K dielectric layer of a second type MOS.

* * * * *